(12) United States Patent
Sofer et al.

(10) Patent No.: US 7,956,594 B2
(45) Date of Patent: Jun. 7, 2011

(54) DEVICE AND METHOD FOR COMPENSATING FOR VOLTAGE DROPS

(75) Inventors: Sergey Sofer, Reshon Letzion (IL); Yehim-Haim Fefer, Petah-Tikva (IL); Valery Neiman, Reshon Letzion (IL)

(73) Assignee: Freescale Semiconductor, Inc., Austin, TX (US)

( * ) Notice: Subject to any disclaimer, the term of this patent is extended or adjusted under 35 U.S.C. 154(b) by 384 days.

(21) Appl. No.: 11/994,754

(22) PCT Filed: Jul. 5, 2005

(86) PCT No.: PCT/IB2005/052230
§ 371 (c)(1),
(2), (4) Date: Jan. 4, 2008

(87) PCT Pub. No.: WO2007/003988
PCT Pub. Date: Jan. 11, 2007

(65) Prior Publication Data
US 2008/0224684 A1  Sep. 18, 2008

(51) Int. Cl.
*G05F 1/575* (2006.01)
(52) U.S. Cl. .................. 323/285; 363/147; 327/540
(58) Field of Classification Search ............... 323/267, 323/285; 327/535, 540; 713/300, 340; 363/147
See application file for complete search history.

(56) References Cited

U.S. PATENT DOCUMENTS

| | | | | |
|---|---|---|---|---|
| 5,164,657 A | * | 11/1992 | Gulczynski | ............ 323/275 |
| 6,041,012 A | | 3/2000 | Banba et al. | |
| 6,058,257 A | | 5/2000 | Nojima | |
| 6,150,870 A | * | 11/2000 | Kang | ............ 327/537 |
| 7,170,308 B1 | * | 1/2007 | Rahim et al. | ............ 324/765 |
| 7,639,033 B2 | * | 12/2009 | Rahim et al. | ............ 324/754.03 |
| 2002/0078409 A1 | | 6/2002 | Marshall et al. | |
| 2004/0030511 A1 | | 2/2004 | Tien et al. | |
| 2004/0049752 A1 | | 3/2004 | Iwanishi et al. | |
| 2004/0057324 A1 | | 3/2004 | Abe et al. | |
| 2004/0238850 A1 | | 12/2004 | Kusumoto | |
| 2005/0040810 A1 | | 2/2005 | Poirier et al. | |
| 2005/0046467 A1 | | 3/2005 | Kase et al. | |

FOREIGN PATENT DOCUMENTS

| | | |
|---|---|---|
| JP | 1993021738 A | 1/1993 |
| WO | 2005050425 A1 | 6/2005 |

OTHER PUBLICATIONS

Choi et al; "Fine-grained dynamic voltage and frequency scaling for precise energy and performance trade-off based on the radio of off-chip access to on-chip computation times"; Design, Automation and Test Conference in Europe, p. 4-9, vol. 1.

* cited by examiner

*Primary Examiner* — Gary L Laxton

(57) ABSTRACT

A device that includes a voltage supply unit and an integrated circuit, the device is characterized by including a voltage sampling circuit adapted to sample voltage levels at multiple sampling points within the integrated circuit, to provide multiple sampled voltages, wherein the multiple sampled voltages reflect the voltage drops; and wherein the voltage supply unit is adapted to adjust a supply voltage provided to the integrated circuit in response to at least one sampled voltage. A method for voltage drop compensation; the method includes providing a supply voltage to an integrated circuit; the method is characterized by sampling voltage levels at multiple sampling points within the integrated circuit, to provide multiple sampled voltages, wherein the multiple sampled voltages reflect the voltage drops; and adjusting a supply voltage provided to the integrated circuit in response to at least one sampled voltage.

20 Claims, 3 Drawing Sheets

US 7,956,594 B2

DEVICE AND METHOD FOR COMPENSATING FOR VOLTAGE DROPS

FIELD OF THE INVENTION

The present invention relates to devices and methods for compensating for voltage drops within an integrated circuit.

BACKGROUND OF THE INVENTION

Modern integrated circuits are required to operate in very high frequencies while consuming a relatively limited amount of power. In order to reduce the power consumption of modern integrated circuits the level of voltage supply has dramatically decreased during the last decade.

This power supply voltage reduction has some drawbacks such as an increased sensitivity to voltage drops (also referred to as IR drops or droops) that are proportional to the current (I) consumed by the integrated circuit and to the resistance (R) of the conductors that are included outside the integrated circuit and inside the integrated circuit.

A voltage drop reduces the voltage that is provided to internal components of the integrated circuit and thus temporarily prevents the integrated circuit from operating in a proper manner.

U.S. Pat. No. 6,058,257 of Nojima, and U.S. patent application publication number 2004/0238850 of Kusumoto, both being incorporated herein by reference, describe apparatus, devices and methods for designing an integrated circuit such as to reduce internal voltage drops.

U.S. patent application publication number 2004/0030511 of Tien et al., being incorporated herein by reference, describes a method for evaluating (by using simulations) voltage drops.

U.S. patent application 2004/0049752 of Iwanishi et al., being incorporated herein by reference, describes an integrated circuit design process that is responsive to voltage drops.

Japanese patent application JP05021738 titled "A semiconductor integrated circuit", being incorporated herein by reference, describes an apparatus that increases the supply voltage by a predetermined amount and during a predefined period once a certain event is detected.

There is a need to provide a device and method for efficiently compensating for voltage drops.

SUMMARY OF THE PRESENT INVENTION

A device and a method for compensating for voltage drops, as described in the accompanying claims.

BRIEF DESCRIPTION OF THE DRAWINGS

The present invention will be understood and appreciated more fully from the following detailed description taken in conjunction with the drawings in which.

DETAILED DESCRIPTION OF PREFERRED EMBODIMENTS

The following figures illustrate exemplary embodiments of the invention. They are not intended to limit the scope of the invention but rather assist in understanding some of the embodiments of the invention. It is further noted that all the figures are out of scale.

The terms voltage "sample" or voltage "sensing" include both discrete sampling and continuous sampling at any given time. A voltage sampling unit outputs a signal that is responsive to (or representative of) of a voltage at one or more sampling points. The sampling can be done in various prior art methods including analog sampling, digital sampling and the like.

Figure 1:
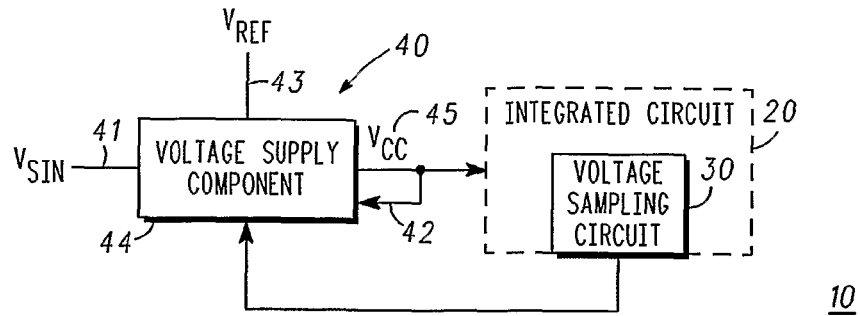
FIG. 1 illustrates a device, according to an embodiment of the invention.

FIG. 1 illustrates a device 10, according to an embodiment of the invention. Device 10 can be any kind of integrated circuit.

Device 10 can include multiple components, including multiple integrated circuits. For convenience of explanation only a single voltage supply unit 40 and a single integrated circuit 20 are illustrated.

Device 10 further includes a voltage sampling circuit 30. The voltage sampling circuit 30 can be included within integrated circuit 20 or can be located at least partially outside integrated circuit 20.

The classical regulated power supply 40 (powered from outside with the voltage Vin 41), includes the regulating element, reference voltage (43) source, circuit that compares reference voltage and feedback voltage and controls the regulating element in order to keep regulated voltage at desired level at the sensing point (point, where the feedback is taken).

It can apply various well known schemes of sensing. For example, the feedback 42 may be connected for closing the control loop internally in the power supply unit 40 or taken from near the integrated circuit 20, powered by the said power supply unit 40 for on-board IR drop compensation.

Conveniently, the voltage supply unit 40 includes an over-voltage protection circuit.

The voltage sampling unit 30 conveniently includes a selection circuit 36 that receives multiple signals from multiple measurement (or sampling) points and selects a subset of signals to be provided to the voltage supply unit 40. The selection reduces the amount of outputted signals and accordingly reduced the number of integrated circuit pins that should be allocated for outputting signals representative of the sampled voltages. It is further noted that time based multiplexing can also be used in order to reduce the amount of utilized integrate circuit pins.

Conveniently, only a single integrated circuit pin is used for outputting signal(s) representative of the sampled voltage but this is not necessarily so.

According to other embodiments of the invention the amount of integrated pins used for outputting the voltage can differ then one.

The inventors used an analog voltage sampling circuit 30 that included an analog selection circuit 36. Circuit 30 elects between multiple sampled voltages in an analog manner and outputs an analog output signal representative of at least one of the sampled voltages. Circuit 30 is relatively simple and also sensitive to small voltage differences that can be smaller than one percent of the supply voltage level.

Those of skill in the art will appreciate that at least circuit (and one of the sampling, selecting and/or outputting stages)

can be implemented in a digital manner. For example, the sampled voltages can be digitally sampled, the selection can be implemented in a digital manner and the output signal can be a digital signal.

Figure 2:
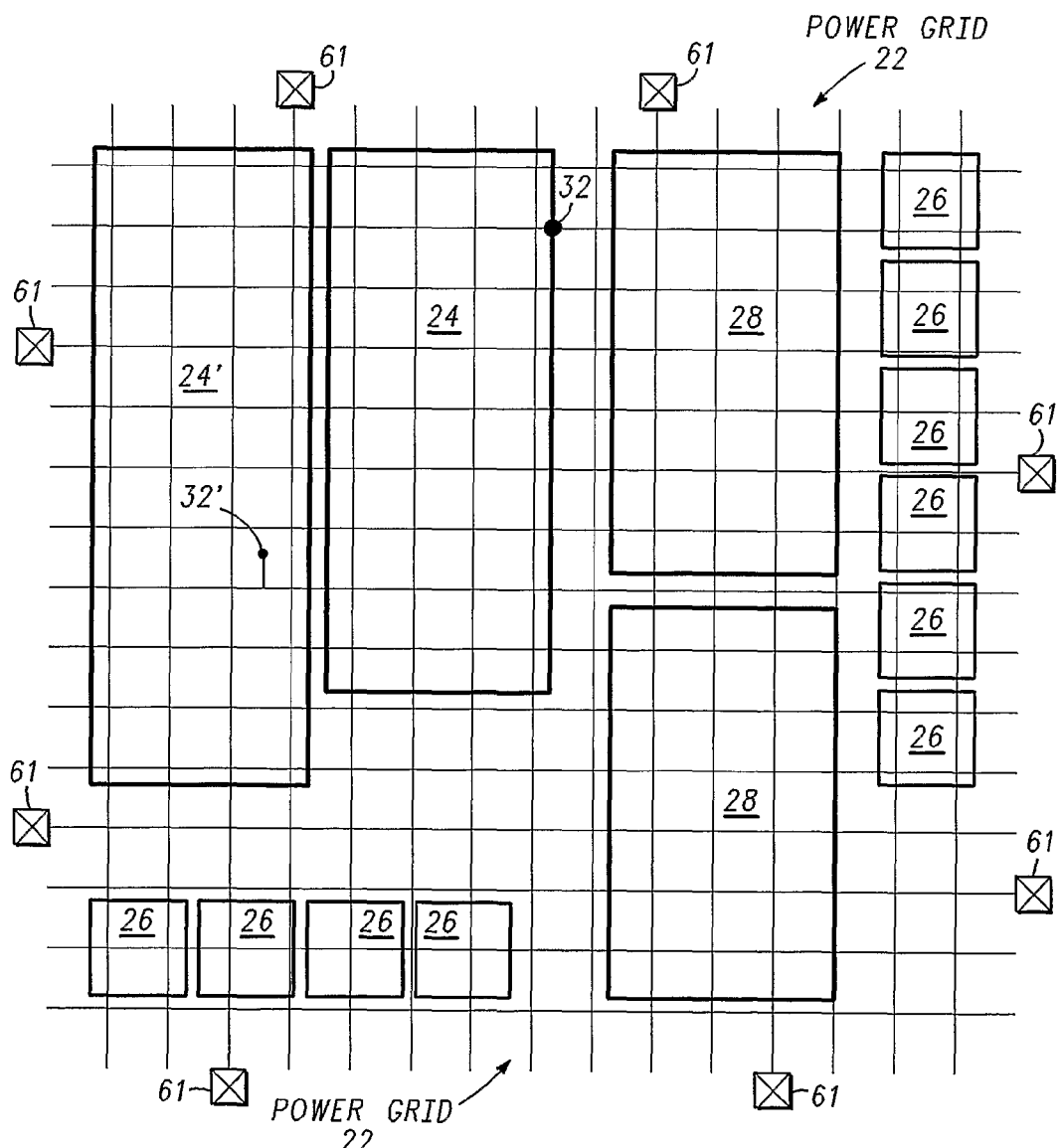
FIG. 2 illustrates various portions of an integrated circuit, according to an embodiment of the invention.

FIG. 2 illustrates various portions of integrated circuit 20, according to an embodiment of the invention.

Integrated circuit 20 includes a supply power grid 22, multiple components such as cores 24 and 241, peripherals 26 and memory units 28. The power supply grid 22 is connected to one or usually multiple integrated circuit pins 61. These pins are connected to the voltage supply unit 40. The power grid 22 is connected to the logic gates, memory cells and the like of the various components of integrated circuit 20.

Two exemplary, non-limiting and out of scale sampling points 32 and 32' are also illustrated. Sampling point 32 is positioned within the area of core 24 while sampling point 24' is located within core 24'. It is noted that much more than a pair of sampling points can be defined within integrated circuit 20.

Internal voltage drops are formed when one or more of these components consumes current, and especially when such a component consumes a substantial current. Such a current consumption is usually associated with high computational load tasks, memory transfer consuming tasks and the like.

The multiple sampling points are selected such as to measure these substantial voltage drops. The selection is usually based upon a simulation of the integrated circuit. Designers are usually well aware of the possible current consuming components. Typically, more than a single sampling point is positioned near a single core. In addition, at least one sampling point can be located in substantially the center of the integrated circuit, or in locations that are relatively far from integrated circuit pins 61.

The voltage sampling circuit 30 includes multiple sampling points (such as points 32 and 32'), conductors 34 that are connected to these points, and selection circuit 36 that selects a subset out of the sampled voltages to be outputted from the integrated circuit 20. Conveniently a single sampled voltage is selected.

Conveniently the voltage sampling circuit 30 consumes a negligible amount of energy and thus the voltage drop across the sampling circuit conductors (66 and 66') is also negligible. Thus, the sampling points can be located at any distance from the selection circuit 36 without substantially affecting the selection.

The voltage sampling circuit 30 outputs one or more signals representative of one or more sampled voltages. Conveniently, a single analog signal (such as the lowest voltage and/or the most significant voltage) is sent to the voltage supply unit 40. The voltage supply unit 40 then adjusts the outputted voltage in response to that (one or more) sampled voltage.

It is noted that the significance of a certain voltage can be influenced from the level of this voltage and/or the location of the sampling point that provides this voltage. For example, sampling points that are connected to a core can be more important than other sampling points. The importance can be responsive to the ability of a certain component to operate with lower voltage levels and/or the possible current changes that can introduced by that component. For example a relatively slow peripheral can usually operate with a lower voltage level than a high speed core.

In case of feedback sensing at Vcc 45, the internal voltage drop will be out of regulation and stay uncompensated. Thus Vcc 45 should be elevated by potential internal voltage drop (with appropriate guard band) in order to keep internal voltage at any point of the chip at least at desired level.

The difference between Vcc 45 and a internally (inside the integrated circuit 20) sampled voltage is responsive to internal voltage drops as well as possible voltage drops that occur between the voltage supply unit 40 and the integrated circuit 20.

Thus, the voltage supply unit 40 can increase the supplied voltage so that internal components of the integrated circuit 20 receive the required voltage level. And thus Vcc 45 level may be reduced by the mentioned potential voltage drop (and guard band).

The voltage supply unit 40 is usually characterized by a response period. This response period is usually long in relation to a clock cycle of a clock signal that activates the integrated circuit 20. Thus, a certain time gap can exist between a certain event (such as a substantial increment of the current consumed by a core) and the response of the voltage supply unit 40.

In order to compensate for this time gap the voltage supply unit 40 can provide a voltage that is slightly higher (by a certain margin) than the voltage required to compensate for a current voltage drop. It is noted that substantially increasing that margin can result in an unnecessary increment in the power consumption of the integrated circuit 20.

Figure 3:
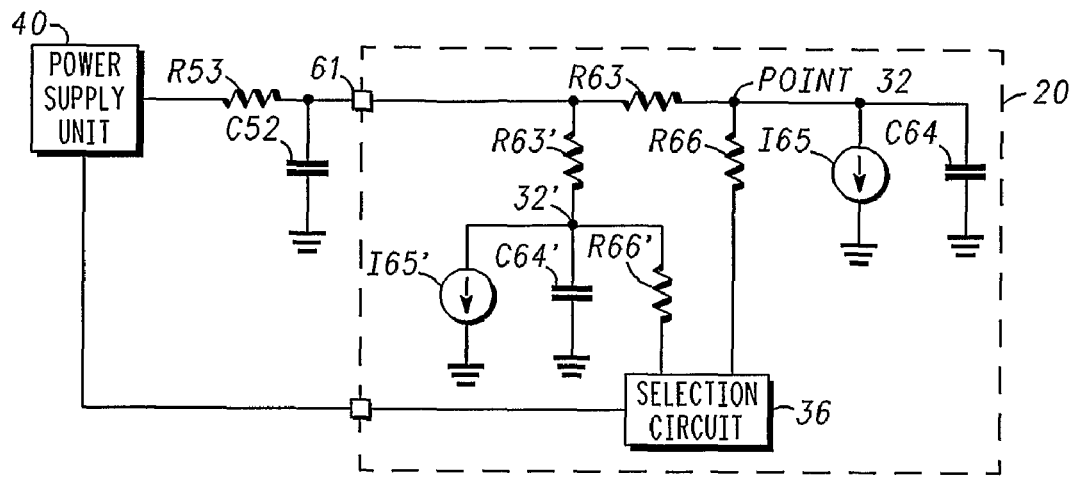
FIG. 3 is a schematic electric diagram illustrating the various resistances and capacitances of a device according to an embodiment of the invention.

FIG. 3 is a simplified electrical equivalent scheme of device 10 illustrating the various equivalent resistances and capacitances of device 10 according to an embodiment of the invention.

This electrical diagram illustrates two sampling points 32' and 32.

Resistor 53 and capacitor 52 represent the impedance of the interconnect lines between the power supply unit 40 to integrated circuit 20. Capacitor 52 represents whole related to Vcc 45 interconnect capacitance and external filter and/or bypass and/or decoupling capacitor(s) of the power supply unit 40. R63 represents the effective resistance of the power grid between integrated circuit power supply pin 61 and the placement of the sampling point 32. R63' represents the effective resistance of the power grid between integrated circuit power supply pin 61 and the sampling point 32' placement. Capacitor 64 represents the local equivalent capacitance of the chip components (like metal interconnect lines, semiconductor components and parasitic elements) connected to the power supply grid near the sampling point 32, current sink 65 represents the current locally drained by the chip active elements located around the sampling point 32, resistor 66 represents the resistance of conductor connected between sampling point 32 and selection circuit 36. Capacitor 64' represents the local equivalent capacitance of the chip components (like metal interconnect lines, semiconductor components and parasitic elements) connected to the power supply grid near the sampling point 32', current sink 65' represents the current locally drained by the chip active elements located around the sampling point 32', resistor 66' represents the resistance of conductor that is connected between sampling point 32' and selection circuit 36. The values of the elements marked and not marked with "'" are not necessary equal.

The following is a description of the connectivity of the simplified electrical equivalent scheme elements of device 10. Vcc 45 is outputted from power supply circuit 40 to one end of resistor 53. The other end of resistor 53 is connected to pin 61 and to one end of capacitor 52. The other end of capacitor 52 is grounded. Pin 61 is connected, via resistor 63 to the part of the chip where the sampling point 32 is placed and via resistor 63' to the part of the chip where the sampling point 32 is placed. Sampling point 32 is connected to a first end of current sink 65 and capacitor 64. The second end of capacitor 64 and current sink 65 is grounded. Sampling point 32 is connected via resistor 62 to selection circuit 36. Sampling point 32' is connected to a first end of current sink 65' and capacitor 64'. The second end of capacitor 64' and current sink 65' is grounded. Sampling point 32' is connected via resistor 62' to selection circuit 36.

An output of selection circuit 36 is connected voltage supply unit 40.

Typical (for modern VLSI circuit) non-limiting values of R53 are 0.01-0.1 Ohm, of R63 (and of R63') are 0.1-10 Ohm, of R66 (and R66') are 10-1000 Ohm, of C52 are 100 pF-100 μF, of C64 (and C64') are 50 pF-1 nF, of current sink I65 (and of I65') are 1-500 mA.

Figure 4:
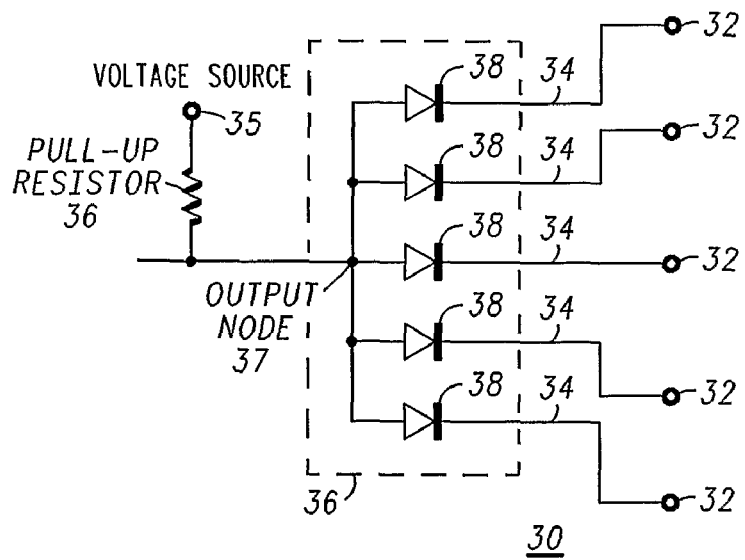
FIG. 4 illustrates a voltage sampling circuit, according to an embodiment of the invention.

FIG. 4 illustrates implementation of the voltage sampling circuit 30, according to an embodiment of the invention (this circuitry has only an illustrative purpose, and can not be used as an implementation example).

FIG. 4 illustrates a configuration that is adapted to operate with positive voltage sources. The connectivity of the diodes should be reversed if the voltage source is negative.

The voltage sampling circuit 30 includes multiple sampling points 32 that are connected via conductors 34 to selection circuit 36 that includes multiple diodes 38 and pull-up resistor 36.

The diodes 38 are connected in parallel to each other, between different conductors 34 and an output node 37. A pull up resistor 36 is connected between the output node 37 and a voltage source that provides a voltage that is higher then the sampled voltages plus the threshold voltage of a diode.

In case of positive power supply the anode of each diode is connected to a conductor while the cathode of all diodes are connected to an output node 37 of the selection circuit 36. The pull-up resistor 36 is also connected between the output node 37 and a voltage source providing a voltage bias for correct circuit operation.

The lowest voltage is provided, by one of diodes to the output node 37 and causes the other diodes to receive a reverse bias voltage and to stop conducting.

If the selection circuit 36 should output multiple sampled voltages than the selection circuit 36 should include multiple output nodes.

Figure 5:
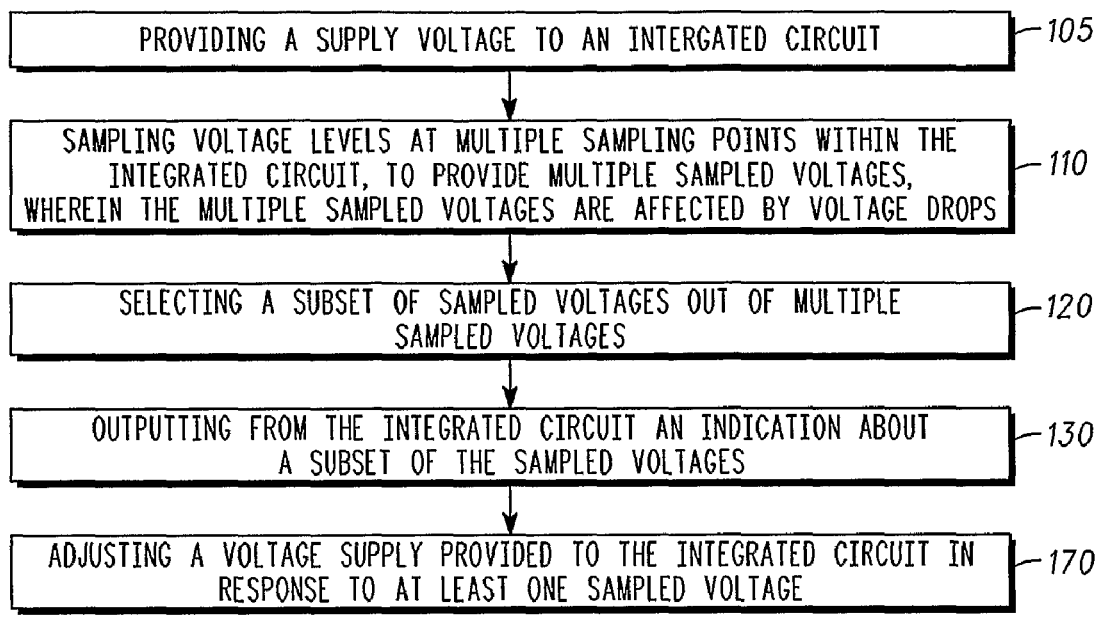
FIG. 5 is a flow chart of a method for compensating from voltage drops according to an embodiment of the invention.

FIG. 5 is a flow chart of the method 100 for voltage drop compensation according to an embodiment of the invention. This method is conveniently performed by device 10 of the present invention. References to various components of device 10 are provided only for convenience of explanation. Those of skill in the art are able, based on the description herein, to apply method also to other systems Conveniently, stages of the various methods can be combined, a stage of a certain method can be executed by applying one or more stages of another method. Some of these combinations are specifically described in the following description, but this is just for convenience of explanation.

Method 100 starts by stage 105 of providing a supply voltage to an integrated circuit.

Stage 105 is followed by stage 110 of sampling a voltage level at multiple points (these samples are referred to as sampled voltages) within the integrated circuit, wherein the voltage of the multiple points is affected by voltage drops.

Stage 110 is followed by stage 120 of selecting a subset of sampled voltages out of multiple sampled voltages.

Conveniently, the selecting 120 includes selecting the lowest sampled voltage.

Conveniently, the selecting 120 is responsive to a priority of a sampling point. According to an embodiment of the invention the selecting 120 involves utilizing a selection circuit.

Stage 120 is followed by stage 130 of outputting (from the integrated circuit) an indication about a subset of the sampled voltages. Conveniently, the subset consists of a single point voltage measurement result.

Stage 130 is followed by stage 170 of adjusting a voltage supply provided to the integrated circuit in response to a voltage level sampled in at least one out of the multiple points. Stage 170 is followed by stage 105.

Conveniently, the adjusting is responsive to at least one power consumption rule and to at least one operational rule. The at least one power consumption rule can define the maximal power consumption allowed, the average allowable power consumption and the like. The adjustment usually tries to find an optimal point of operation that allows operating without consuming too much power.

The said above may not be necessary supported by the selection circuit 30 on FIG. 4 (given for illustrative purpose only), and may require more complex solution.

Conveniently, the adjusting is characterized by a response period and exhaustive the providing 105 includes providing a supply voltage that substantially compensates for the response period. The response period can be determined by the voltages supply unit 40, and various functional and parasitic resistances and capacitances and the like.

According to an embodiment of the invention device 20 includes multiple (K) integrated circuits. These integrated circuits can be associated with one or more (J) adjustment circuits. When multiple integrated circuits receive a supply voltage Vcc from the same voltage supply unit then the selection circuitry can include multiple selection stages in which a first stage selects voltages sampled from a single integrated circuit while the second stage selects between the sampled voltages of different integrated circuit. It is noted that other configuration can be provided.

Variations, modifications, and other implementations of what is described herein will occur to those of ordinary skill in the art without departing from the spirit and the scope of the invention as claimed. Accordingly, the invention is to be defined not by the preceding illustrative description but instead by the spirit and scope of the following claims.

We claim:

1. A method for power supply voltage drop compensation within an integrated circuit, the method comprises:
   providing a supply voltage to the integrated circuit;
   sampling voltage levels at multiple sampling points located at different locations within the integrated circuit, to provide multiple sampled voltages, wherein the multiple sampled voltages reflect the voltage drops at the multiple sampling points;
   selecting a subset of sampled voltages out of the multiple sampled voltages, the subset not including a first voltage of the multiple sampled voltages; and
   adjusting a voltage supply provided to the integrated circuit based on the subset of sampled voltages, and not based on the first voltage.

2. The method according to claim 1 further comprising providing a voltage supply that is higher than a voltage required to compensate for a voltage drop.

3. The method according to claim 1 further comprising outputting from the integrated circuit an indication about the subset of the sampled voltages.

4. The method according to claim 1 wherein the subset consists of a single voltage measurement.

5. The method according to claim 1 wherein the selecting comprises selecting the lowest sampled voltage of the multiple sampled voltages.

6. The method according to claim 1 wherein the selecting is based on a priority of a sampling point.

7. The method according to claim 6, wherein sampling points that are connected to a core of the integrated circuit are associated with a higher priority than other sampling points.

8. The method according to claim 6, wherein the priority of the sampling point is responsive to an ability of a component of the integrated circuit associated with the sampling point to operate with a lower voltage level.

9. The method according to claim 1 wherein the adjusting is characterized by a response period and wherein the providing comprises providing the supply voltage to substantially compensate for the response period.

10. The method according to claim 6, wherein the priority of the sampling point is responsive to current changes that can be introduced by a certain component of the integrated circuit associated with the sampling point.

11. A device comprising a voltage supply unit and an integrated circuit, the device comprising:
a voltage sampling circuit adapted to sample voltage levels at multiple sampling points located at different locations within the integrated circuit, to provide multiple sampled voltages, wherein the multiple sampled voltages reflect the voltage drops, the voltage sampling circuit is adapted to select a subset of sampled voltages out of the multiple sampled voltages, the subset not including a first voltage of the multiple sampled voltages; and
wherein the voltage supply unit is adapted to adjust a voltage supply provided to the integrated circuit based on at least one sampled voltage of the subset of the sampled voltages and not based on the first voltage.

12. The device according to claim 11 wherein the voltage supply unit is adapted to supply a voltage that is higher than a voltage required to compensate for a voltage drop.

13. The device according to claim 11 wherein the voltage sampling circuit is adapted to output from the integrated circuit an indication about the subset of the sampled voltages.

14. The device according to claim 11 wherein the subset consists of a single voltage measurement.

15. The device according to claim 11 wherein the voltage sampling circuit is adapted to select the lowest sampled voltage for the subset of the sampled voltages.

16. The device according to claim 11 wherein the voltage sampling circuit is responsive to a priority of a sampling point.

17. The device according to claim 16, wherein sampling points that are connected to a core of the integrated circuit are associated with a higher priority than other sampling points.

18. The device according to claim 16, wherein the priority of the sampling point is responsive to an ability of a certain component of the integrated circuit associated with the sampling point to operate with a lower voltage level.

19. The device according to claim 11 wherein the voltage supply unit is characterized by a response period and is adapted to provide a voltage that substantially compensates for the response period.

20. The device according to claim 16, wherein the priority of the sampling point is responsive to current changes that can be introduced by a certain component of the integrated circuit associated with the sampling point.

* * * * *